United States Patent [19]

Guzik et al.

[11] Patent Number: 4,829,545
[45] Date of Patent: May 9, 1989

[54] METHOD AND APPARATUS FOR DATA WINDOW CENTERING IN A MULTIFREQUENCY DATA SEPARATOR

[75] Inventors: Nahum E. Guzik, Mountain View; Gennady Mangeym; Tony K. Yung, Both of San Jose, all of Calif.

[73] Assignee: Guzik Technical Enterprises, Inc., San Jose, Calif.

[21] Appl. No.: 899,626

[22] Filed: Aug. 25, 1986

[51] Int. Cl.$^4$ .............................................. H03D 3/02
[52] U.S. Cl. ...................................... 375/120; 375/82; 331/1 A; 360/51; 328/155
[58] Field of Search .................... 375/82, 120, 95, 110, 375/118, 119; 331/1 A, 11, 25; 360/43, 51, 36.1, 36.2; 307/269; 328/155, 63

[56] References Cited

U.S. PATENT DOCUMENTS

| | | | |
|---|---|---|---|
| 3,656,149 | 4/1972 | Srivastava | 340/347 DD |
| 3,810,234 | 5/1974 | Monett | 340/174.1 A |
| 3,944,940 | 3/1976 | Desai | 331/11 |
| 4,143,407 | 3/1979 | Liberty | 360/51 |
| 4,149,201 | 4/1979 | Card . | |
| 4,185,273 | 1/1980 | Gowan . | |
| 4,280,099 | 7/1981 | Rattlingourd et al. | 375/119 |
| 4,365,211 | 12/1982 | Lee | 331/11 |
| 4,534,044 | 8/1985 | Funke et al. . | |
| 4,593,254 | 6/1986 | Coburn | 331/1 A |

FOREIGN PATENT DOCUMENTS 0064196 11/1982 European Pat. Off. .
167813 9/1984 Japan .

OTHER PUBLICATIONS

National Semiconductor DP 8460 Data Separator—Gen'l Description, 12/83, pp. 1-21.
IBM Technical Disclosure Bulletin, v. 21, No. 6, Nov. 1978, p. 2246.

Primary Examiner—Robert L. Griffin
Assistant Examiner—Marianne Huseman

[57] ABSTRACT

A method for data window centering a multifrequency data separator (12) based on having the frequency of a voltage-controlled oscillator (20) at least twice that of read data window frequency, and setting delay of a delay line (14) used in the data separating process so that arriving raw data pulses will be more accurately assigned to their corresponding windows. The method is realized by providing the multifrequency data separator with a phase comparator emulator (30) and a counter (28). According to another embodiment, the apparatus comprises a counter (28b) combined with a delay setting logic unit (40). The method and apparatus described above result in window centering which does not essentially depend on timing characteristics of circuitry used in the construction of the data separator.

28 Claims, 10 Drawing Sheets

METHOD AND APPARATUS FOR DATA WINDOW CENTERING IN A MULTIFREQUENCY DATA SEPARATOR

BACKGROUND

Field of the Invention

The present invention relates to digital recording and data transmission, more particularly to a method for centering the data window in multifrequency data separators and to an apparatus for carrying out the method. Data separators are used for processing and recovering data read from various recording media, such as magnetic or optical, or received over transmission lines.

BACKGROUND OF THE INVENTION

The explanation of prior art is presented below with reference to FIGS. 1-5, wherein:

FIGS. 3A, B, C, D, E, F, G, H, J, K, L, and P are timing diagrams illustrating the operation of the apparatus of FIG. 1.

FIGS. 4A, B, C, D, E, F, G, and H are timing diagrams illustrating the detection of raw read data pulses by the apparatus of FIG. 1 when its delay line setting is correct.

FIGS. 5A, B, C, D, E, F, G, and H are timing diagrams illustrating the detection of raw read data pulses by the apparatus of FIG. 1 when its delay line setting is incorrect.

The apparatus of FIG. 1, discussed below, is representative of the prior art but is not to be identified with any specific prior art reference. The description of this model data separator is intended to elucidate the data separator of the present invention.

Digital data transmission and reproduction processes involve noise, non-linearities, and bandwidth limitations (all such distortion hereafter referred to as noise) which could cause loss of information. Reading or receiving systems circuits which remove timing noise from the signal and make it available for further digital processing are called data separators. A typical data separator is shown in FIG. 1. The main purpose of data separators is to recover the original signal and present it in the form in which it was originally transmitted with the lowest probability of errors.

Figure 2:
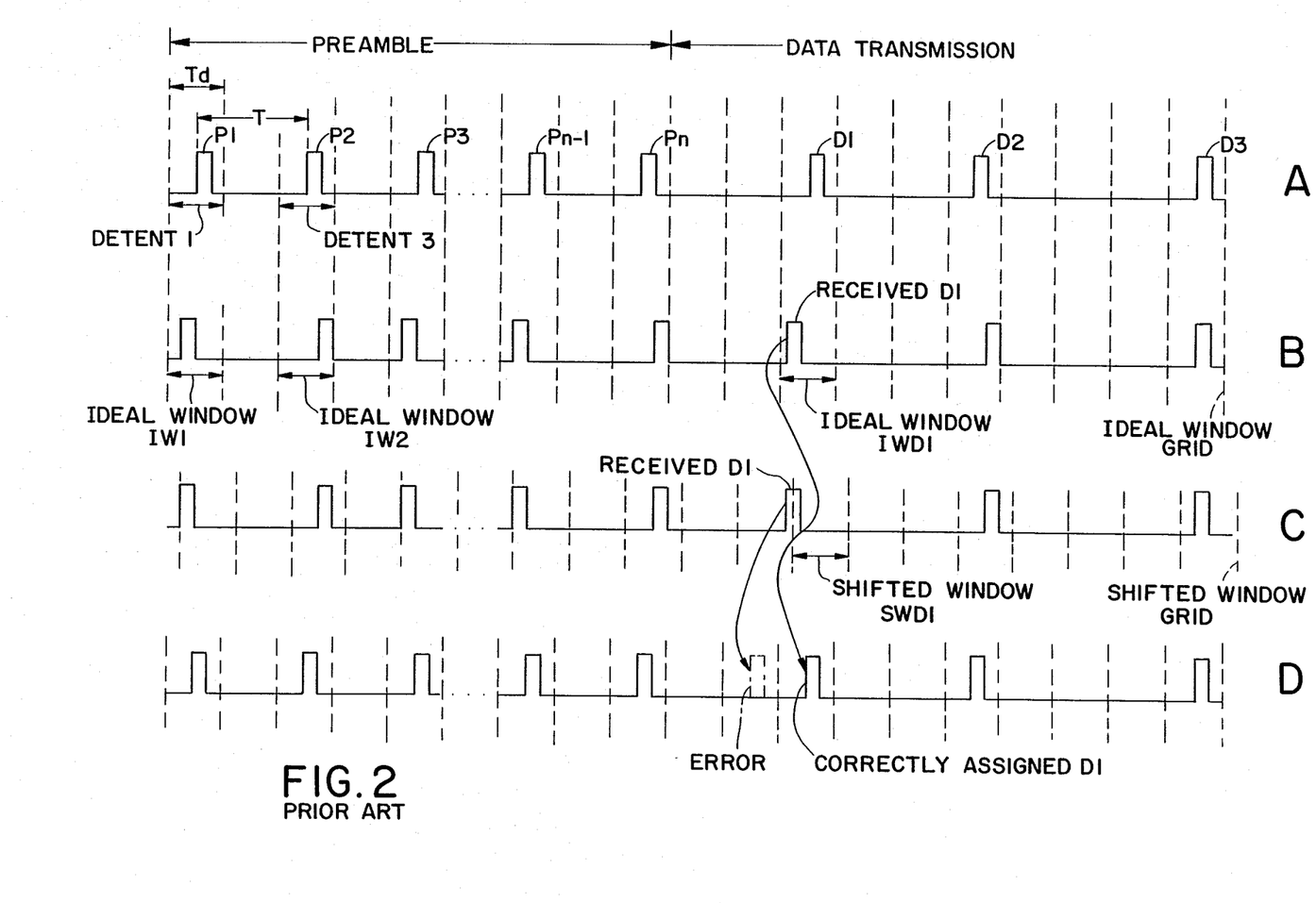
FIG. 2A is a timing diagram of a typical transmitted data message.
FIG. 2B is a timing diagram of a received data message with jitter and ideal data window grid.
FIG. 2C is a timing diagram of a received data message with jitter and shifted window grid.
FIG. 2D is a timing diagram of a recovered data message.

A typical serial data message consists of a preamble and a data transmission part. FIG. 2A shows an ideal transmitted message. The PREAMBLE portion of the message consists of n regularly spaced pulses with period T, namely P1, P2 . . . Pn, where n is an integer which is determined by the particular system. The pulses of the PREAMBLE carry timing synchronization information.

As can be seen from FIG. 2A, the time during which the message is transmitted can be subdivided into timing increments that will further be referred to as detents and characterized by detent frequency $f_d$. In FIG. 2A the length of a detent is designated by $T_d$. The leading edge of the preamble pulse P1 occurs exactly in the center of detent 1, and the leading edge of the preamble pulse P2 occurs exactly in the center of detent 3. Therefore, in this particular preamble pulses are spaced by two $T_d$.

As shown in FIG. 2A the distance between the data pulses D1 and D2 is equal to three $T_d$, and the distance between the data pulses D2 and D3 is equal to four $T_d$, and every data pulse is generated exactly in the center of a detent. Any detent may contain a data pulse, and all generated data pulses have to be separated by an integer number of detents. Therefore, a detent is the minimum parcel of time in which the presence or absence of a pulse indicates a data bit.

FIG. 2B illustrates the message of FIG. 2A after it has been read or received. In the presence of noise, the distance in time between the received pulses of the preamble in this example will remain equal to two detents on the average. The timing positions when the pulses of the preamble are received are averaged over n pulses by a phase locked loop and the oscillator of the phase locked loop originates data windows. Pulses are recognized as belonging to a particular window when they arrive within plus or minus ½ of the detent from the center of the window.

If the center of the window is shifted right or left in time with respect to the statistical timing average of received data pulses, the probability of incorrect interpretation is increased. This condition is called incorrect window centering. It is illustrated in FIG. 2C.

In FIG. 2B, the received versin of the data pulse D1 arrives early within its ideal window IWD1. The window grid of FIG. 2B is centered correctly and this pulse is assigned to its proper window. The correctly assigned data pulse D1 can be seen in FIG. 2D which illustrates the received message after timing noise has been removed by a data separator.

The window grid of FIG. 2C is shifted off center. As a result the received version of D1 is assigned to the wrong window and an error results, as shown by the dashed line in FIG. 2D.

Figure 1:
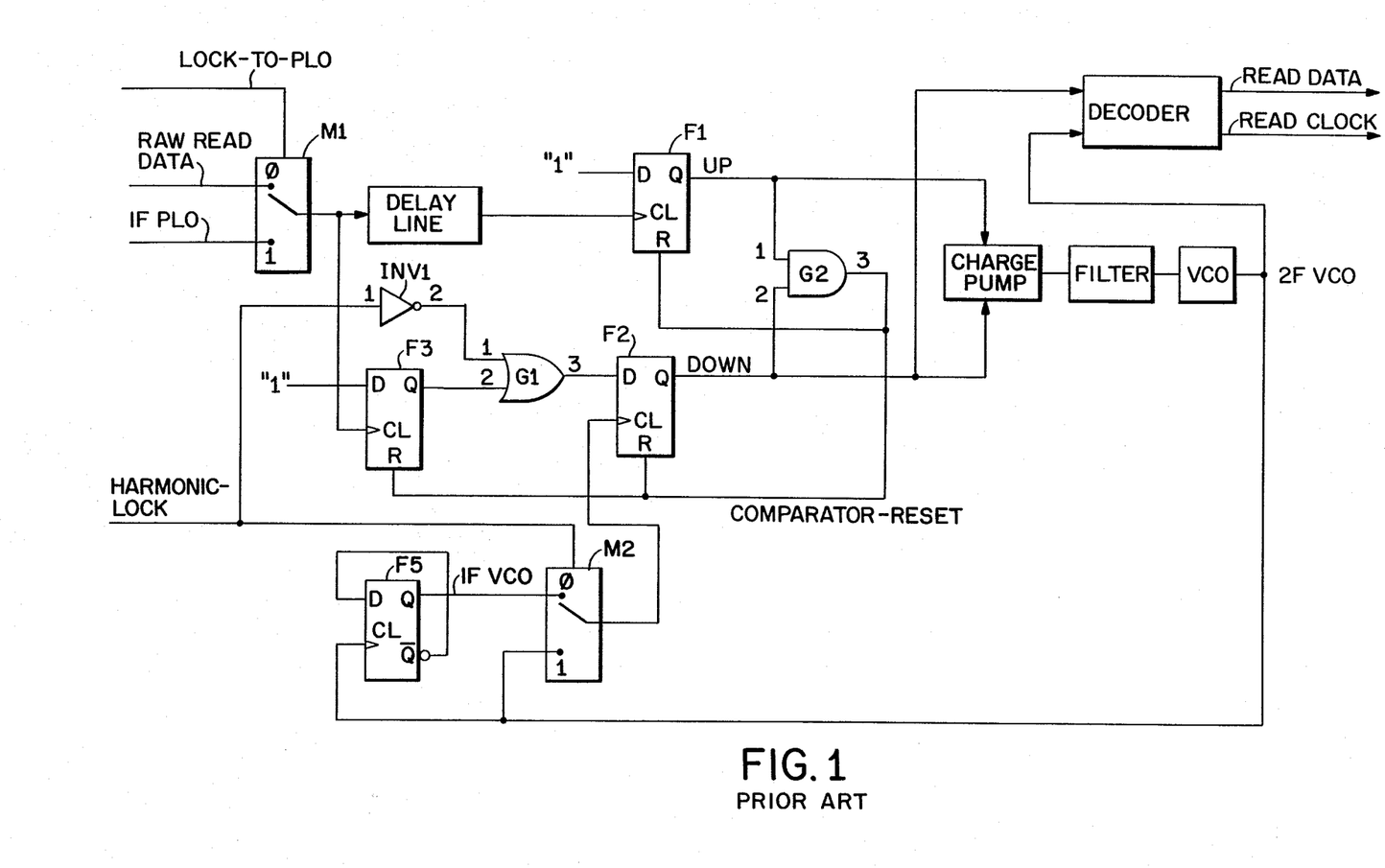
FIG. 1 is a diagram of a data separator typical of prior art.

The model data separator of FIG. 1 consists of a phase locked loop, a delay line, a decoder, and control logic. The phase locked loop includes a phase comparator formed by the D flip-flops F1 and F2 and gate G2; flip-flop F3 which enables the phase comparator when the harmonic-lock signal is "low"; a voltage-controlled oscillator (VCO); a charge pump with a filter which translates the timing error outputs of the phase comparator into an analog signal which controls the VCO; and a binary divider flip-flop F5; a multiplexer M2 which selects either the output of the VCO (2F VCO, where 2F is the detent frequency or in alternative notation, $f_d$), or the output of flip-flop F5 (1F VCO, where 1F is ½ of the detent frequency) to be applied to the phase comparator. The operation of the decoder depends on the particular coding scheme and is not described in detail. The decoder provides two outputs, read data and read clock for further data processing.

The delay line is nominally set to ½ of the detent. Multiplexer M1 selects either raw read data signal or the output signal of an external reference phase lock oscillator (not shown), 1F PLO. The 1F PLO signal is used for the initial frequency setting of the VCO.

In the general case, the external reference phase lock oscillator frequency (here represented by the signal 1F PLO) is related to $f_d$ by a factor $1/j$, e.g. $(1/j) F_{ref} = f_d$, where j is a positive integer. It is also possible to use reference signals for which the frequency is expressible as $m/n\ f_d$ or $(1/p)\ f_d$ to set the initial frequency of the VCO where m, n and q are positive integers.

Figure 3:
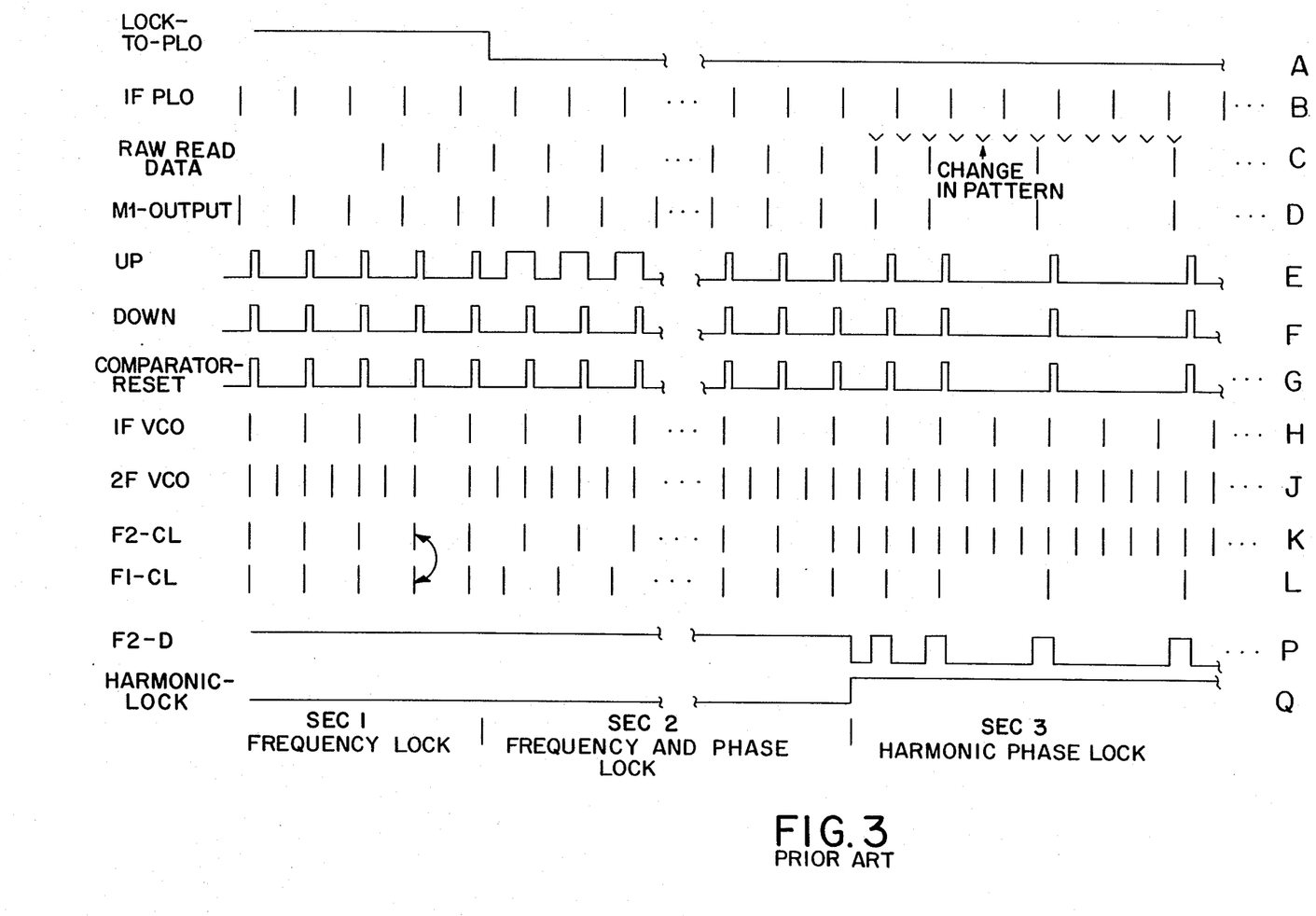

In FIG. 3 some signals have only their triggering edges shown by vertical bars.

In the stand-by mode of operation the control signal LOCK-TO-PLO is set "high" (Sec. 1 of FIG. 3A) and, as a result the reference signal 1F PLO, alternate notation, $f_{ref}$ (Sec. 1 of FIG. 3B) is selected to the input of the phase locked loop by multiplexer M1 (Sec. 1 of FIG. 3D). The control signal HARMONIC-LOCK is set "low" during this stage (Sec. 1 of FIG. 3Q). As a result, the 1F VCO signal (eg., $\frac{1}{2}\ f_d$) is selected to the clock CL input of the phase comparator flip-flop F2 by multiplexer M2 (Sec. 1 of FIG. 3K). The D input of flip-flop F2 is set "high" throughout the frequency lock stage (Sec. 1 of FIG. 3P). In this mode every 1F VCO rising edge is compared with every 1F PLO rising edge delayed by the delay line. As a result, the signals on the clock inputs of flip-flops F1 and F2 are aligned in frequency and phase as shown in Sec. 1 of FIGS. 3K and 3L. When the phase locked loop is in equilibrium, the UP and DOWN pulses are of the same length (Sec. 1 of FIGS. 3E and F).

In the general case the frequency of the signal here represented as 1F VCO may bear a relation to $f_d$ as $(1/p)\ f_d$, where p is a positive integer.

When an external controller (not shown) determines that the preamble of a raw read data message is being received, it sets the control signal LOCK-TO-PLO "low" as shown in Sec. 2 of FIG. 3A. This causes the raw read data signal to be applied to the input of the delay line (Sec. 2 of FIG. 3D). Even though the frequency of the VCO is equal to the frequency of the preamble pulses, their phases are not necessarily the same. In the case shown, this results in the UP pulses (Sec. 2 of FIG. 3E) being longer than the DOWN pulses (Sec. 2 of FIG. 3F). This causes a transient in the frequency of the VCO output which, when settled, results in the phases of the 1F VCO signal and the data pulses at the clock input of flip-flop F1 being aligned (Sec. 2 of FIGS. 3E and F).

When enough time has elapsed to achieve the proper phase alignment the HARMONIC-LOCK signal is set "high" (Sec. 3 of FIG. 3F). This results in the data or harmonic mode of operation of the phase locked loop. In this mode when a data pulse arrives and sets flip-flop F3 it enables a phase comparison between the delayed data pulse and the rising edge of the 2F VCO signal which is now being selected by multiplexer M2 (Sec. 3 of FIGS. 3K and L).

In the data message described by this example the end of the preamble is indicated by a change in pattern (Sec. 3 of FIG. 3C). Now data pulses may occur within any data window whose centers are indicated by above Sec. 3 of FIG. 3C. Presence of a DOWN pulse at the end of a window indicates to the decoder that a data pulse has been recovered during that window.

Figure 4:
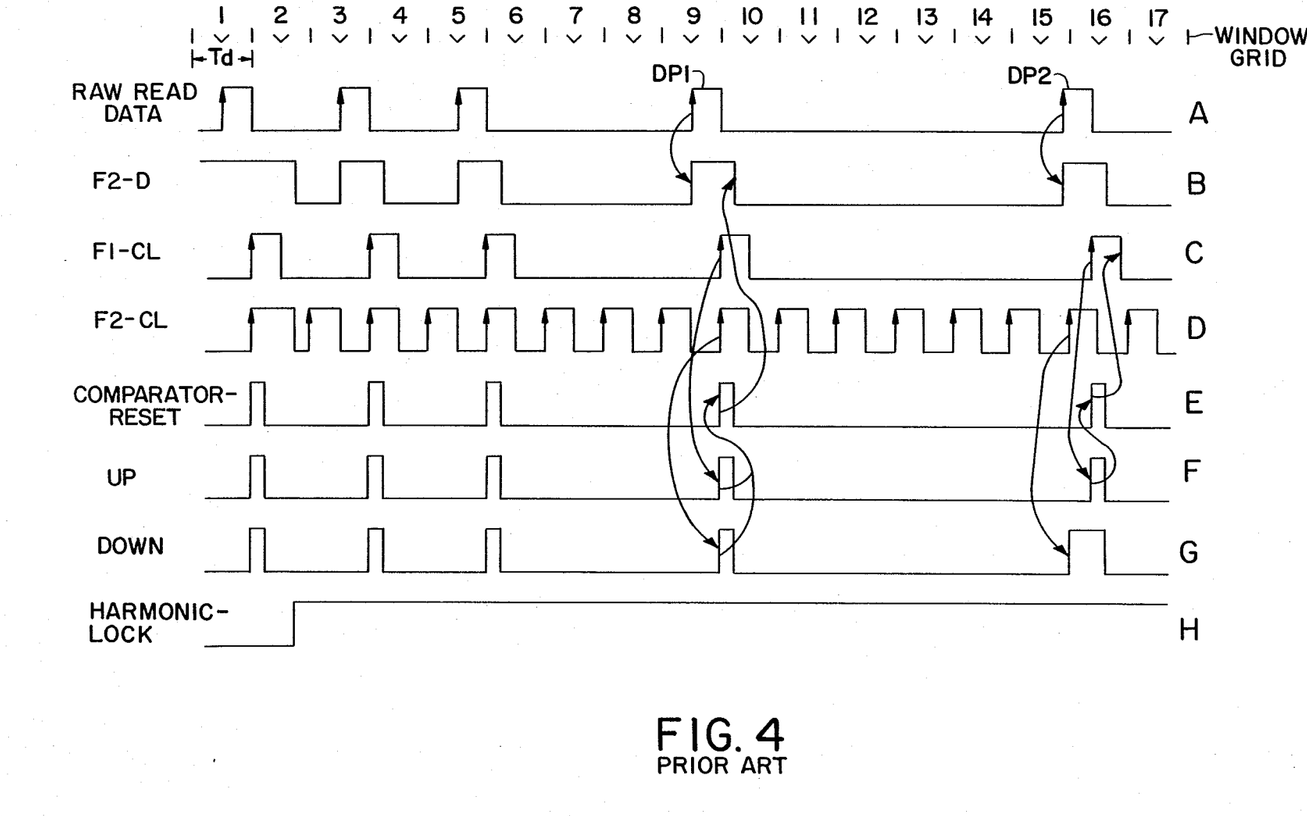

The operation of the model data separator in this mode can be better described by referring to FIG. 4 which magnifies Sec. 3 of some of the timing diagrams of FIG. 3. In FIG. 4 all components of FIG. 1 are idealized. All gates have zero propagation delays; all flip-flops have zero set-up times; flip-flop F3 has zero propagation delay between the clock input and the output Q; flip-flops F1 and F2 have equal propagation delays between their respective clock inputs and outputs Q; and the charge pump is symmetrical. The window grid at the top of FIG. 4 has windows numbered from 1 to 17.

The delay between the time when flip-flop F2 is enabled by an arriving data pulse (which sets flip-flop F3) and when flip-flop F1 is clocked is set to $\frac{1}{2}$ of the detent by the delay line.

In FIG. 4A all raw read data pulses except for DP2 are shown arriving without jitter. That is, the rising edges of these pulses, excepting DP2 are aligned with the centers of the windows. When the data pulse DP1 arrives, it sets flip-flop F3 (FIG. 4B) thereby enabling the phase comparison. Its delayed version (FIG. 4C) is compared with the rising edge of the 2F VCO signal (FIG. 4D) resulting in equal UP and DOWN pulses (FIGS. 4F and G).

The data pulse DP2 is late in its data window 15 (FIG. 4A). Because the leading edge of the DOWN pulse or recovered data occurs during the correct data window the decoder is able to correctly assign pulse DP2.

Figure 5:
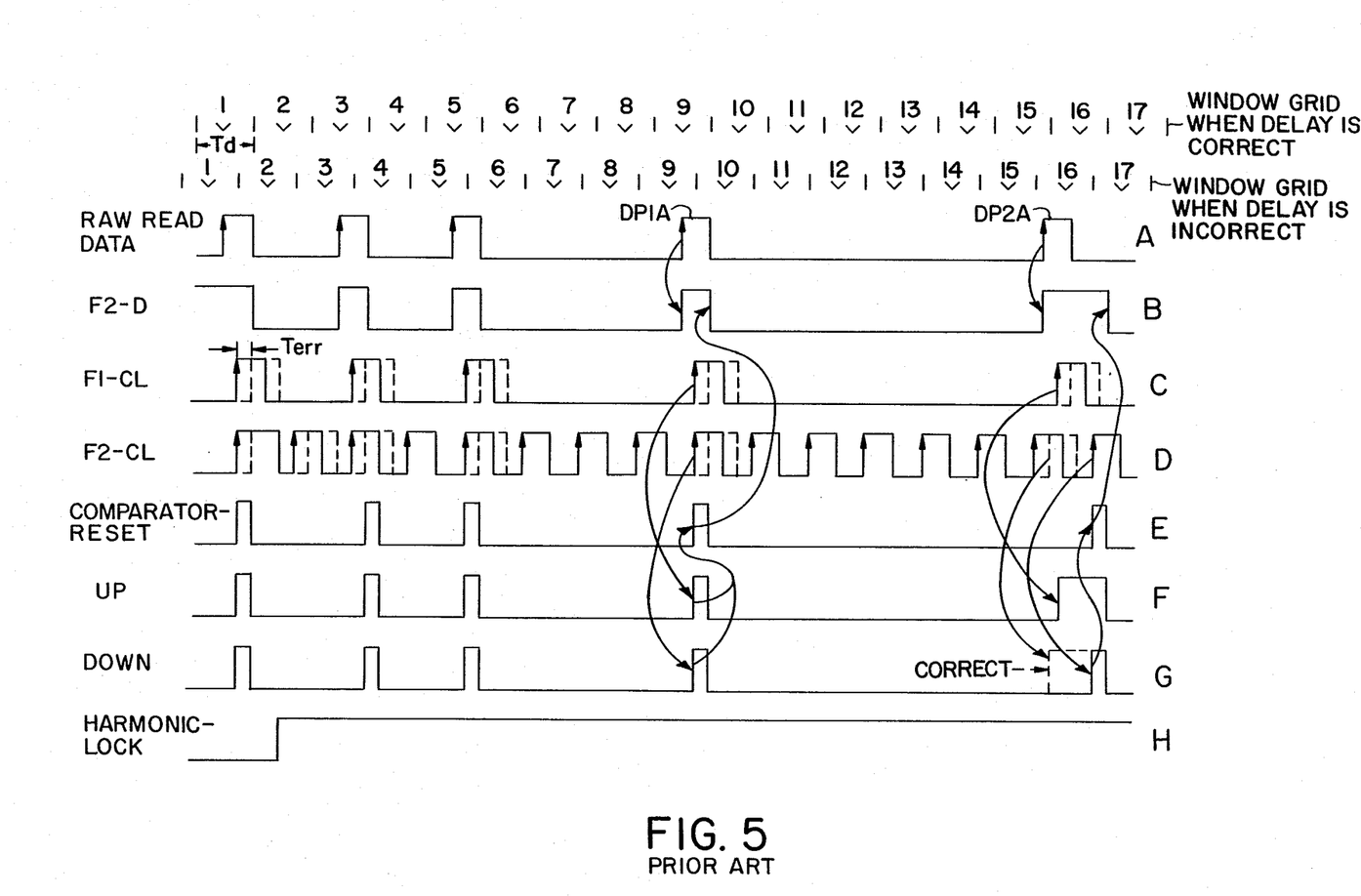

An example of data processing when the delay of the delay line is set shorter than $\frac{1}{2}$ of the detent by the amount $T_{err}$ is shown in FIG. 5. The timing positions of signals in the case of the correct delay setting are indicated by dashed lines. There are two window grids at the top of FIG. 5. One of them corresponds to the correct delay setting and is the same as in FIG. 4. The other one corresponds to the incorrect delay of FIG. 5 and is shifted with respect to the correct window grid by the amount $T_{err}$.

The data pulse DP1A arrives without jitter (FIG. 5A) and is correctly decoded. The data pulse DP2A (FIG. 5A) arrives later than the statistical average of the previous data pulses by less than than $\frac{1}{2}$ of the detent. That places it within correct window 15. If the window setting is shifted due to incorrect setting of the delay line, the enabling flip-flop F3 is not set early enough for the rising edge of the 2F VCO signal corresponding to window 15 (FIG. 5D) to set flip-flop F2. This results in the flip-flop F2 being set by the following rising edge of the 2F VCO signal and the DOWN pulse or normalized data is erroneously identified with window 16 instead of 15, e.g., an error.

Therefore, it has been demonstrated that the correct setting of the delay of the delay line is very important in the typical prior art data separator represented by the model apparatus of FIG. 1. In practice, all gates and flip-flops have non-zero set-up times and propagation delays, and these cannot be completely matched among different gates and flip-flops. As a result, the optimum setting of the delay of the delay line depends on the particular components used. However, conventional data separators have no internal means to monitor the correctness of the setting of the delay line, i.e., they have no internal means for window centering. To set the delay line, for example, one would have to produce a data signal with simulated jitter and look for a setting of the delay line resulting in the least number of errors. This method is cumbersome because it requires a calibrating signal and procedure and is difficult to automate.

In practice conventional methods such as the one described above have never been completely successful in digital recording/reproducing systems such as magnetic disk drives or the like. As a result, the effective window margin is reduced. This imposes stringent bit jitter tolerances on drive mechanisms, thereby making these devices more expensive to manufacture.

With increased speeds of digital data transmission in modern data recording/reproducing systems, the size of the window has become about the same order of magnitude as time delays or timing parameters of devices used in the circuitry of data separators. Thus window centering has become the "bottle neck" of the industry because of the necessity to utilize devices with constantly increasing accuracy of matching. In practice this is not achievable in mass production.

This problem becomes even more complicated in systems with variable recording frequencies because in such systems window centering has to be done every time the frequency is changed.

Therefore there is a demand in the industry for data separators equipped with improved means for data window centering.

Objects and Advantages

Accordingly, it is an object of the present invention to provide a method for data window centering in a multi-frequency data separator essentially without relying on time delays and timing parameters of devices used in its construction. Another object is to provide a method for data window centering which is characterized by high accuracy, reliability and improved noise immunity. Still another object is to provide a simple and reliable apparatus for carrying out the above-mentioned method. Other objects and advantages of the invention will be apparent to those skilled in the art from the ensuing description and accompanying drawings.

The Essence of the invention

The essence of the invention is compactly described as follows. For centering of the window of a data separator, a reference crystal controlled signal is applied to its data input. Two sets of windows are generated. The first one for data processing, as described in the background section above and the second one advanced with respect to the first one by $\frac{1}{2}$ of the detent interval $T_d$. Centering of the window is performed by automatically adjusting the relative time delay between the two window sets while referencing the data pulses with respect to the shifted window set.

DRAWINGS REPRESENTATIVE OF THE INVENTION

FIGS. 7A, B, C, D, E, F, G, H, J, K, L, P, Q, and R are timing diagrams illustrating the operation of the apparatus of FIG. 6.

FIGS. 9A, B, C, D, E, F, G, H, J, K, L, P, Q, R, S, and T are timing diagrams illustrating the operation of the apparatus of FIG. 8.

DETAILED DESCRIPTION OF THE INVENTION

Figure 6:
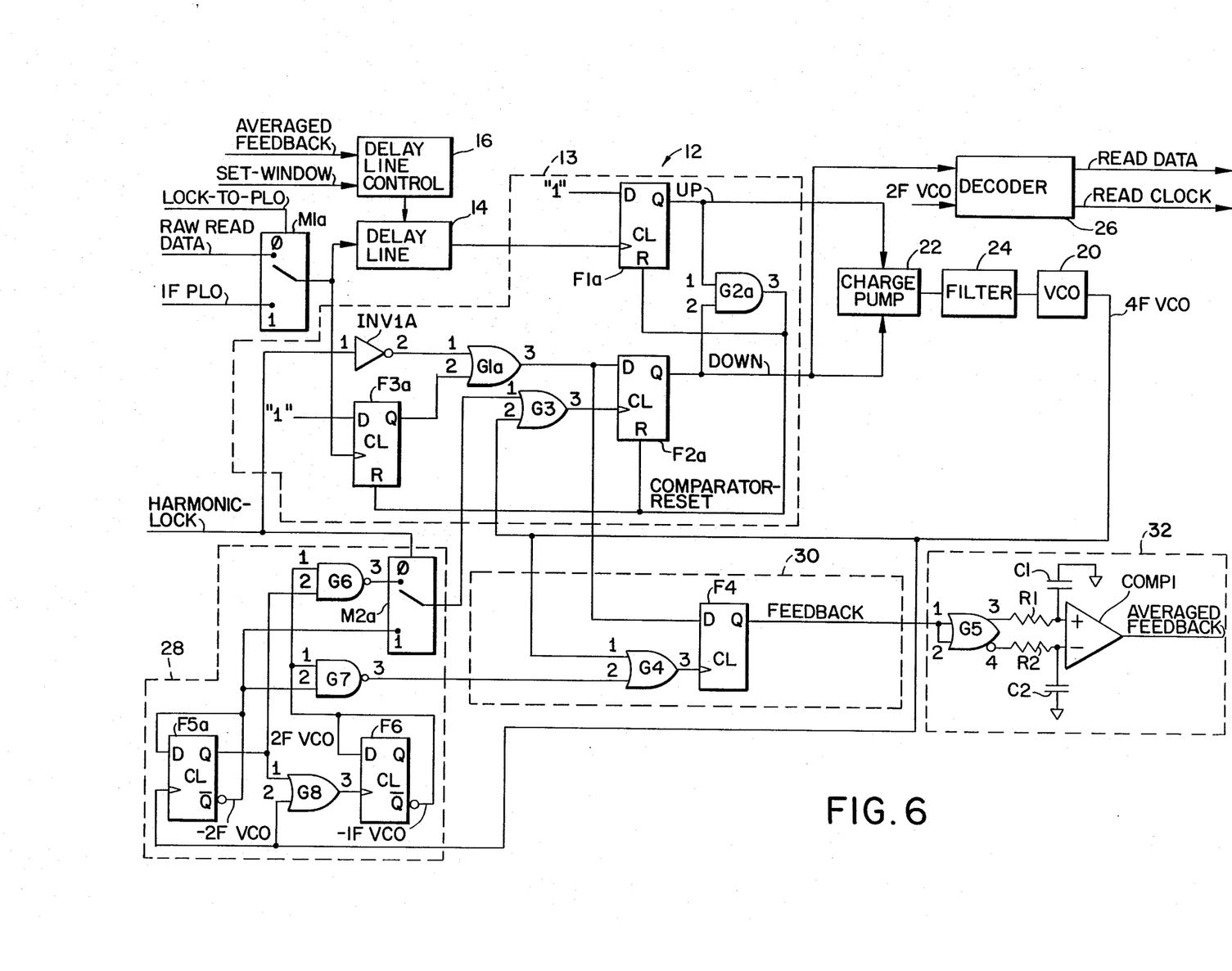
FIG. 6 is an embodiment of an apparatus for realization of the method of the present invention.

The present invention can be realized by means of an apparatus shown in FIG. 6. In the description of the apparatus of the invention those parts which are similar to corresponding parts of conventional apparatus of FIG. 1 are designated by the same reference numerals but with addition of suffix "a".

Figure 10:
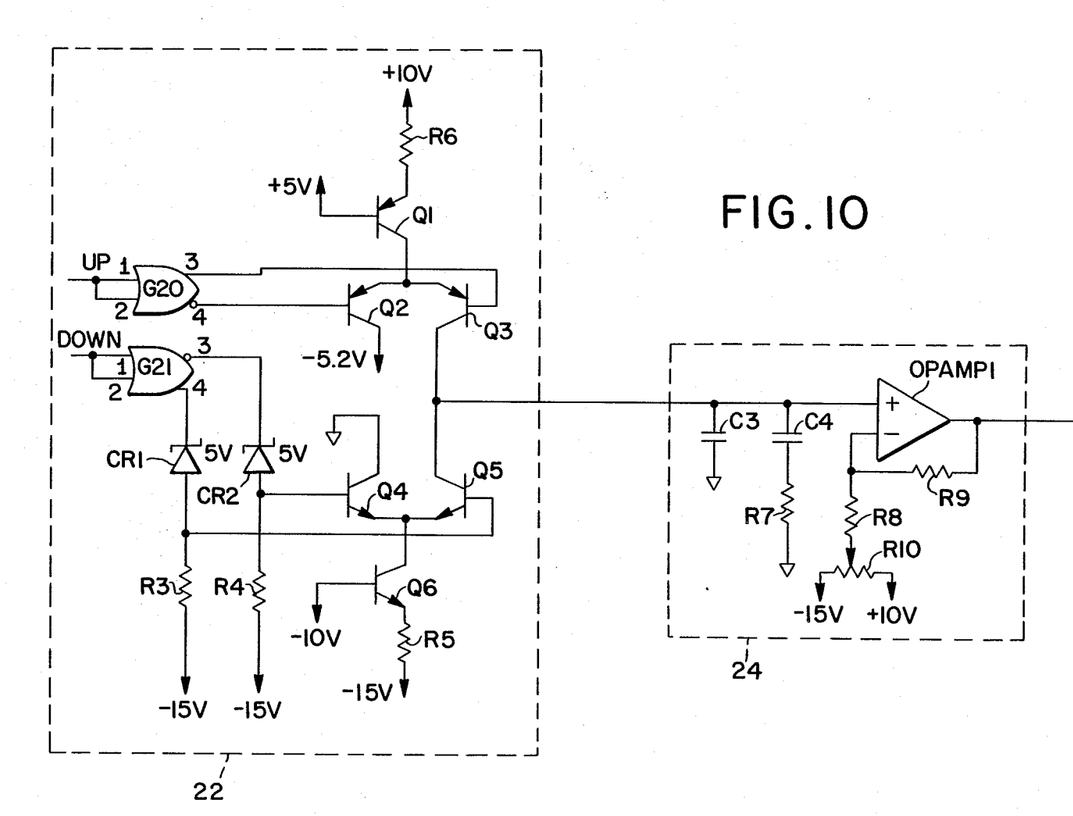

The apparatus comprises a data separator designated generally by reference numeral 12. Data separator 12 comprises a phase comparator 13 (described in detail later) which compares the raw read data stream coming from read circuitry (not shown) or a signal from a phase lock oscillator (PLO) (also not shown in the drawings) through a multiplexer M1a and a delay line 14 with the phase or frequency of a voltage-controlled oscillator (VCO) 20. The VCO suitable for the purpose of the present invention may be one described in MECL Device Data Book, Motorola Inc., 1983, p. 4-3. Multiplexer M1a is controlled by the LOCK-TO-PLO input from external control circuitry (not shown). The UP and DOWN outputs of phase comparator 13 are connected to a charge pump 22. A suitable charge pump, whose operation is not described in detail, is shown in FIG. 10. It comprises two differential pairs controlled by buffer gates G20 and G21 each of which has inputs 1 and 2 and outputs 3 and 4. The first differential pair comprises two PNP transistors Q2 and Q3. They are biased by a current source formed by a PNP transistor Q1 and resistor R6. The bases of tranistors Q2 and Q3 are connected to outputs 4 and 3 respectively of gate G20 which buffers the UP signal.

The second differential pair comprises two NPN transistors Q4 and Q5.

They are biased by a current source formed by an NPN transistor Q6 and a resistor R5. The base of transistor Q4 is connected to the anode of a Zener diode CR2 and to a resistor R4. The base of transistor Q5 is connected to the anode of a Zener diode CR1 and to a resistor R3. The cathodes of diodes CR1 and CR2 are connected to outputs 4 and 3 respectively of gate G21 which buffers the DOWN signal.

The collector of transistor Q2 is connected to the −5.2 V power supply and the collector of transistor Q4 is connected to ground. The collectors of transistors Q3 and Q5 are connected together.

The output of charge pump 22 is connected to a filter 24 which is also shown in FIG. 10. It comprises a frequency-response shaping network consisting of capacitors C3 and C4 and a resistor R7 as well as a level shifting amplifier comprising an operational amplifier OPAMP1 (such as an LF353 manufactured by the National Semiconductor Corp.) and resistors R9 and R8 and a potentiometer R10. The operation of filter 24 is not described as it is known to a person skilled in the art.

Referring back to FIG. 6, the output of filter 24 is connected to the input of VCO 20. The DOWN output of phase detector 13 is connected to a decoder 26 which converts the detected data into the NRZ format. The decoder can be of any type suitable for this purpose. It could, for instance, be an MFM or a run length limited code decoder. The technique of construction of such decoders is known to a person skilled in the art. The output of VCO 20 is applied to a counter 28 which is formed by flip-flops F5a and F6 (each of which has a D input, clock CL input, and positive and negative Q outputs), gates G6, G7 and G8 (each of which has inputs 1 and 2, and an output 3) and a muliplexer M2a.

More specifically, the output of VCO 20 is connected to the clock CL input of flip-flop F5a and input 2 of gate G8. The input D of flip-flop F5a is connected to its negative Q output as well as to input 2 of gate G7 and input 1 of multiplexer M2a. The output Q of flip-flop F5a is connected to input 1 of gate G8 as well as to input 2 of gate G6 and to decoder 26. Output 3 of gate G8 is connected to clock CL input of flip-flop F6. The negative Q output of flip-flop F6 is connected to its D input as well as to input 1 of gate G7 and input 1 of gate G6. The output 3 of gate G6 is connected to input 0 of multiplexer M2a. The output of multiplexer M2a is connected to input 1 of gate G3 of phase comparator 13. Multiplexer M2a is controlled by the HARMONIC-LOCK signal. The output 3 of gate G7 is connected to input 2 of gate G4 of an emulator 30 which is described in detail later.

Now phase comparator 13 will be described in detail. It consists of flip-flops F1a, F2a and F3a (each of which has a D input, clock CL input, reset R input and an output Q), gates G1a, G2a and G3 each of which has inputs 1 and 2 and an output 3. The UP output of flip-flop F1a is connected to input 1 of gate G2a. The DOWN output of flip-flop F2a is connected to input 2 of gate G2a. Output 3 of gate G2a is connected to the reset R inputs of flip-flops F1a, F2a and F3a. The D input of flip-flop F3a is held "high" and the clock input of flip-flop F3a is connected to the output of multiplexer M1a. The Q output of flip-flop F3a is connected to input 2 of gate G1a. Input 1 of gate G2a is connected to output 2 of inverter INV1a wich inverts the harmonic-lock signal. Output 3 of gate G1a is connected to the D input of flip-flop F2a and to the D input of flip-flop F4 of emulator 30. Output 3 of gate G3 is connected to the clock CL input of flip-flop F2a. The D input of flip-flop F1a is held "high". The clock input of flip-flop F1a is connected to the output of a delay line 14.

Gate G4 (which has inputs 1 and 2, and an output 3) and flip-flop F4 (having a D input, clock CL input, and an output Q) form emulator 30 for gates G3 and flip-flop F2a respectively of phase comparator 13. Input 1 of gate G4 is connected to the 4F VCO output of VCO 20 as well as to input 2 of gate G3 of phase comparator 13. Output 3 of gate G4 is connected to the clock CL input of flip-flop F4. The Q output of flip-flop F4 is connected to inputs 1 and 2 of a gate G5 of a feedback averaging unit 32 which will now be described.

Outputs 3 of gate G5 is connected to an integrator formed by a resistor R1 and a capacitor C1. Output 4 of gate G5 is connected to an integrator formed by a resistor R2 and a capacitor C2. The two filters are in turn connected to the positive and negative inputs respectively of a comparator COMP1 (which could be an LM392 comparator manufactured by the National Semiconductor Corp.).

The averaged feedback output of comparator COMP1 is applied to a delay line control 16 which also accepts the SET-WINDOW signal from an external controller (not shown) applied to it.

Figure 7:
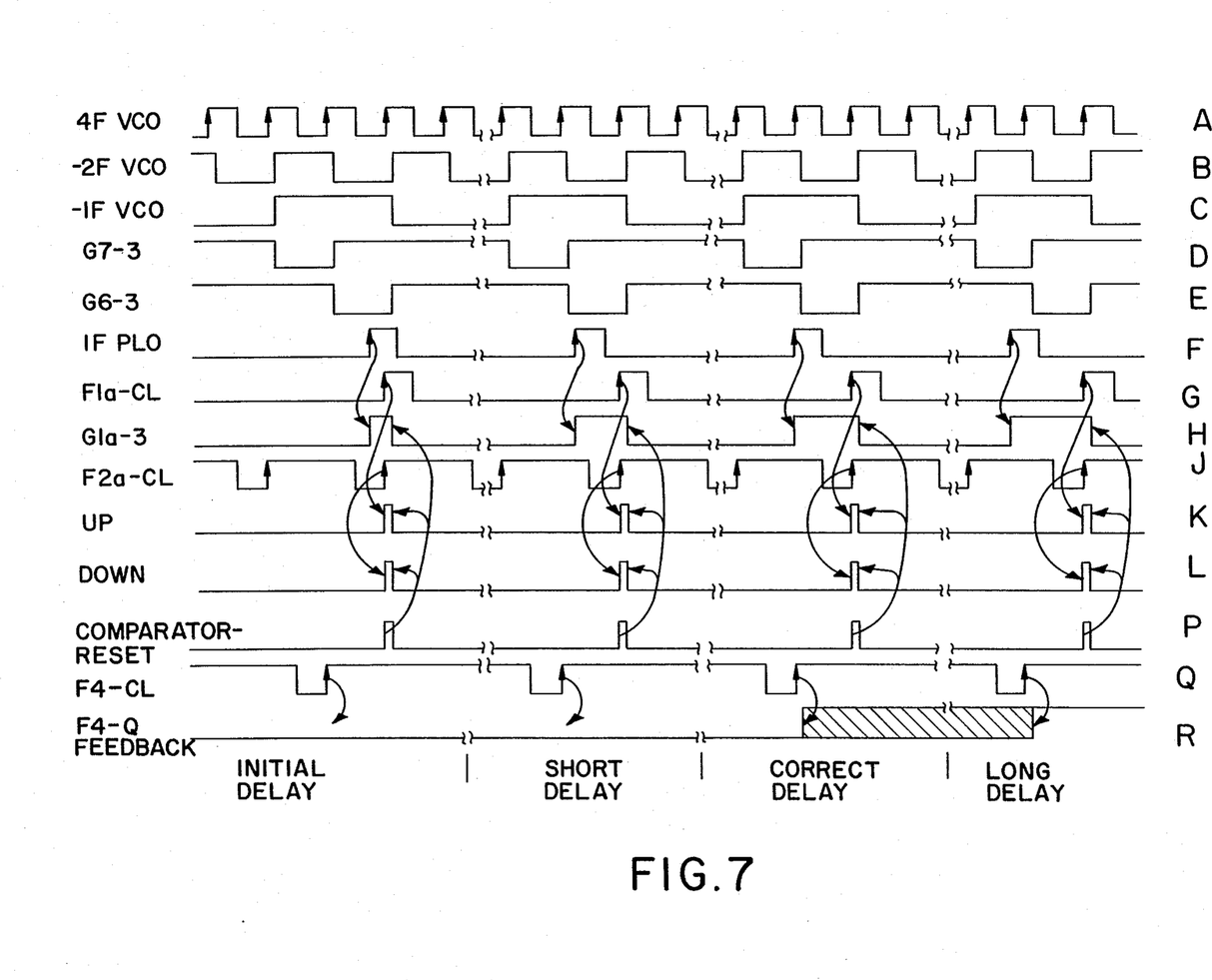

The operation of the apparatus of FIG. 6 is described with reference to the timing diagram (FIG. 7) of the data window centering sequence according to the method of the invention. In this description charge pump 22 is assumed to be symmetrical.

The apparatus of FIG. 6 has internal capabilities to monitor the correctness of the setting of delay line 14 by means of flip-flop F4 and gate G4.

The sequence of window centering occurs as follows:

First, the period of the 4F VCO signal (FIG. 7A) is set to ¼ of the detent by phase and frequency locking the VCO to the external signal 1F PLO (FIG. 7F). The frequency lock mode is set by setting the control signal HARMONIC-LOCK "low" and setting the control signal LOCK-TO-PLO "high". In this case phase comparator flip-flop F2a is clocked by the output signal of gate G6 of counter 28 having freqency 1F (FIG. 7E) selected by multiplexer M2a and strobed by the leading edge of the 4F VCO signal.

The HARMONIC-LOCK signal is then set "high" resulting in the data or harmonic mode of operation (described earlier for the apparatus of FIG. 1) and in flip-flop F2a being clocked by the negative 2F VCO signal (FIG. 7B) selected by multiplexer M2a and strobed by the leading edge of the 4F VCO signal.

Flip-flop F4 of emulator 30 is clocked by the output signal of gate G7 of counter 28 having frequency 1F (FIG. 7D) strobed by the leading edge of the 4F VCO signal. As can be seen by comparing FIGS. 7J and 7Q, flip-flop F4 is clocked exactly ¼ of the detent interval earlier than flip-flop F2a.

The control signal SET-WINDOW is then set "high". As a result, delay line control 16 sets the delay of delay line 14 to the minimum value. The phase-locked loop aligns the signals on the clock inputs of phase comparator flip-flops F1a and F2a as can be seen from the INITIAL DELAY section of FIGS. 7G and J.

If the delay of delay line 14 is set short, the D input of flip-flop F4 is low when its clock signal arrives (INITIAL DELAY and SHORT DELAY sections of FIGS. 7H and Q). Therefore, the FEEDBACK output of flip-flop F4 remains "low" (INITIAL DELAY and SHORT DELAY sections of FIG. 7R). The AVERAGED FEEDBACK output of comparator COMP1 also remains "low" indicating to delay line control 16 that the delay of delay line 14 has to be increased.

Delay line control 16 increases the delay slowly enough to allow the phase-locked loop to realign the signals on the clock inputs of phase comparator flip-flops F1a and F2a. When that delay is increased just to the point where the D input of flip-flop F4 becomes "high" early enough to enable the setting of flip-flop F4 (CORRECT DELAY section of FIGS. 7H and Q), flip-flop F4 gets set intermittently, as determined by the system noise (CORRECT DELAY section of FIG. 7R). The FEEDBACK output of flip-flop F4 is buffered by gate G5 and sent to comparator COMP1 through integrators formed by R1 and C1 and by R2 and C2. The averaged feedback output is "high" if the feedback signal is "high" more than 50% of the time, and "low" if the feedback signal is "low" more than 50% of the time. This mode of operation results in the FEEDBACK signal being "high" essentially 50% of the time indicating that proper window centering is achieved.

For the purposes of illustration, the case of setting the delay too long is also illustrated. In this case the FEEDBACK output of flip-flop F4 remains high as illustrated in the LONG DELAY section of FIG. 7R. Therefore in this case the delay has to decreased to achieve window centering.

Two sets of windows are generated during the sequence of window centering described above. The first one is generated by the signal clocking phase comparator flip-flop F2a, and it is used for data processing. The second one is generated by the signal clocking phase comparator emulator flip-flop F4, and it is advanced with respect to the first one by exactly ¼ of the detent. As shown, centering of the first window was judged by the timing of the reference signal with respect to the advanced window in accordance with the method of the invention.

The accuracy of window centering in the apparatus of FIG. 6 depends on matching the D input setup times of flip-flops F2a and F4 and on matching the propagation delays of gates G3 and G4. Tight matching can be obtained by using, for example, an ECL integrated circuit, MC10131, manufactured by Motorola Inc., which contains two D-type flip-flops and two OR gates.

The apparatus of FIG. 6 is an attractive embodiment of the method of the invention because of the simplicity of additional circuit components compared with traditional data separators.

In general, the signal produced for clocking F4 (FIG. 7Q) may exhibit a frequency of $j/q\, f_d$ where q is a positive integer less than (or equal to) j, j is a positive integer as hereinbefore set forth and j is an integer multiple of q. Similarly for the general case, the signal apllied to F2A (FIG. 7J) may exhibit a frequency of $(j/k)\, f_d$, where k is a positive integer less than (or equal to) j and j is an integer multiple of k.

Figure 8:
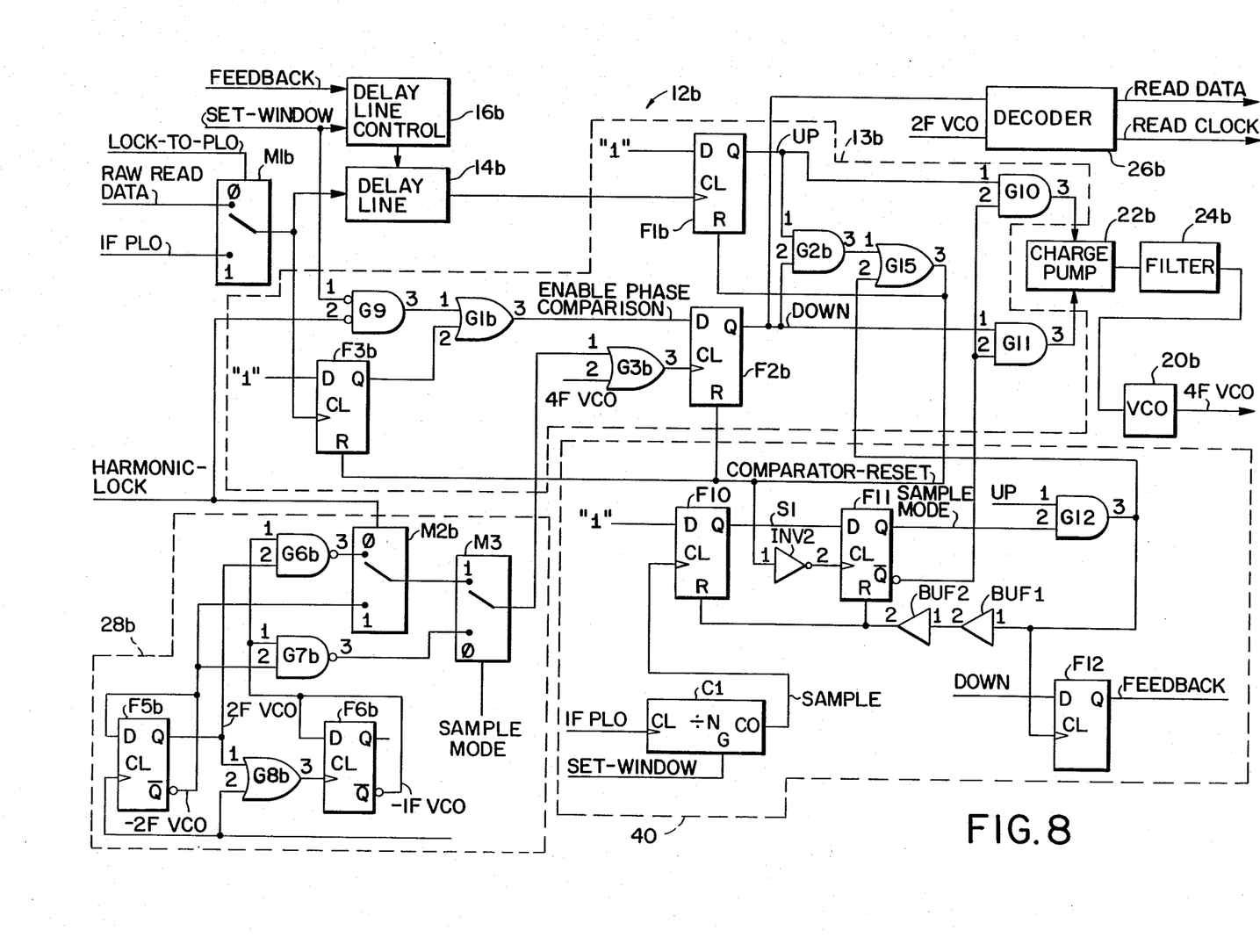
FIG. 8 is another embodiment of an apparatus of the invention.

The method of the present invention can also be realized with the use of an apparatus shown in FIG. 8. In FIG. 8 those parts and elements which correspond to similar parts and elements of FIG. 6 are designated by the same reference numerals but with an addition of suffix "b".

The apparatus comprises a data separator designated generally by reference numeral 12b. The data separator comprises a phase comparator 13b (described in detail later) which compares the raw read data stream coming from read circuitry (not shown) or from a phase lock oscillator (PLO) (also not shown in the drawings) through a multiplexer M1b with the phase or frequency of a voltage-controlled oscillator (VCO) 20b. The VCO can be the same as described above in connection with the apparatus of FIG. 6. Multiplexer M1b is controlled by the LOCK-TO-PLO input from external control circuitry (not shown).

Outputs 3 of gates G10 and G11 of phase detector 13b are connected to charge pump 22b which in turn is connected to a filter 24b. Filter 24b is connected to VCO 20b. The DOWN output of phase detector 13b is connected to a decoder 26b which converts the detected data into the NRZ format. The decoder can be the same as the one mentioned above in connection with apparatus of FIG. 6. The output of VCO 20b is connected to a counter 28b which is formed by flip-flops F5b and F6b, gates G6b, G7b and G8b and multiplexer M2b and M3. The above-mentioned elements are of the same type used in counter 28a described in connection with FIG. 6, i.e., they have similar inputs, outputs, etc. The only difference between counters 28a and 28b is that an additional multiplexer M3 is introduced into counter 28b. The output of multiplexer M2b is connected to input 1 of multiplexer M3 and the output 3 of gate G7b is connected to input 0 of multiplexer M3. The output of multiplexer M3 is connected to input 1 of gate G3b of phase comparator 13b which will now be described.

Phase comparator 13b consists of flip-flops F1b, F2b and F3b as well as gates G1b, G2b, G3b, G9, G15, G10 and G11. The UP output of flip-flop F1b is connected to input 1 of gate G10, input 1 of gate G2b as well as to input 1 of gate G12 of delay setting logic unit 40. The DOWN output of flip-flop F2b is connected to input 1 of gate G11 as well as to input 2 of gate G2b and the D input of flip-flop F12 of delay setting unit 40 which will be described later. Output 3 of gate G2b is connected to input 1 of gate G15. Input 2 of gate G15 is connected to output 3 of gate G12 as well as to CL clock of flip-flop F12 and input 1 of a buffer BUF1 of a delay setting logic unit 40. Output 3 of gate G15 is connected to reset R inputs of flip-flops F1b, F2b, and F3b as well as to input 1 of inverter INV2 of delay logic unit 40. Inputs 2 of gates G10 and G11 are connected to each other and to the negative Q output of flip-flop F11 of delay setting logic unit 40.

The D input of flip-flop F3b is "held" high and the clock CL input of flip-flop F3b is connected to the output of multiplexer M1b as well as to delay line 14b. The Q output of flip-flop F3b is connected to input 2 of gate G1b. Input 1 of gate G1b is connected to output 3 of gate G9. Output 3 of gate G1b is connected to the D input of flip-flop F2b while the clock CL input of flip-flop F2b is connected to output 3 of gate G3b. Input 2 of gate G3b is connected to the output of VCO 20b. The D input of flip-flop F1b is held "high" whereas the clock CL input of flip-flop F1b is connected to the output of delay line 14b.

Now the above-mentioned delay setting logic unit (40) will be described. It comprises: a modulo N counter C1 having a clock CL input, an enable G input, and a carry out CO output; flip-flops F10, F11 and F12; and gate G12. The Q output of flip-flop F10 is connected to input D of flip-flop F11. The D input of flip-flop 10 is held "high". The clock CL input of flip-flop F10 is connected to carry out CO output of counter C1. The clock CL input of counter C1 is connected to 1F PLO signal similar to the one described in connection with FIG. 6. The SET-WINDOW signal is applied to the enable G input of counter C1, to the delay line control 16b, and to input 1 of gate G9. This SET-WINDOW signal may be supplied from an external source such as a computer (not shown).

The clock CL input of flip-flop F11 is connected to output 2 of inverter INV2. The output Q of flip-flop F11 is connected to input 2 of gate G12 as well as to the control input of multiplexer M3 of counter 28b. The output 2 of buffer BUF1 is connected to input 1 of buffer BUF2. The output 2 of buffer BUF2 is connected to the reset R inputs of flip-flops F10 and F11. The output Q of flip-flop F12 is connected to the second input of delay line control 16b.

The LOCK-TO-PLO signal coming from the external control circuitry (not shown) is connected to the control input of multiplexer M1b. The HARMONIC-LOCK signal also coming from the external control circuitry is connected to input 2 of gate G9 and the control input of multiplexer M2b.

Two external signals (1F PLO and raw read data) coming from the external control circuitry (not shown) are applied to the inputs of multiplexer M1b.

The connections between charge pump 22b, filter 24b, and VCO 20b are the same as between the corresponding units of the apparatus shown in FIG. 6.

The apparatus of FIG. 8 is similar in principle of operation to that of FIG. 6. It has a more complicated control system and its data window centering sequence is slower, but it offers absolute accuracy which does not depend on the matching of timing characteristics of circuit components.

Figure 9:
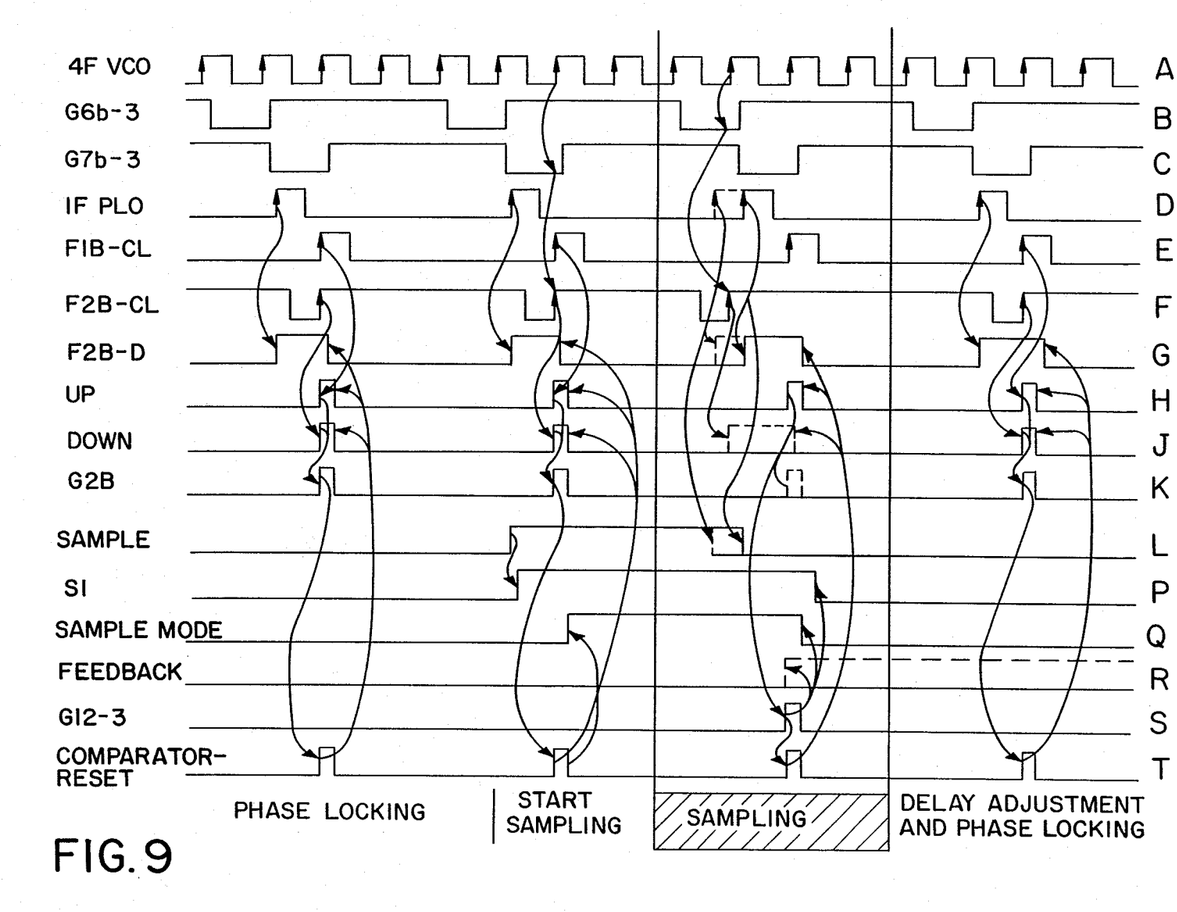

The sequence of window centering occurs as follows:

First, the period of the 4F VCO signal (FIG. 9A) is set to ½ of the detent by phase and frequency locking the VCO to the external signal 1F PLO (FIG. 9D). The frequency lock mode is set by setting the control signals HARMONIC-LOCK and SET-WINDOW "low" and setting the control signal LOCK-TO-PLO "high". In this case phase comparator flip-flop F2b is clocked by the output signal of gate G6b of counter 28b having frequency 1F (FIG. 9B) selected by multiplexers M2b and M3 and strobed by the leading edge of the 4F VCO signal.

The control signal SET-WINDOW is then set "high" resulting in the following conditions:

(a) data or harmonic mode of operation described earlier for the apparatus of FIG. 1;
(b) enabling of modulo N counter C1;
(c) delay line control 16 setting the delay of delay line 14 to the minimum value.

The phase-locked loop aligns the signals on the clock inputs of phase comparator flip-flops F1b and F2b as can be seen from the PHASE LOCKING section of FIGS. 9E and F.

To verify the correctness of window centering, after N pulses of the 1F PLO signal following the setting of control signal SET-WINDOW "high", the carry output (SAMPLE output) of counter C1 becomes high (START SAMPLING section of FIG. 9L) and thereby sets flip-flop F10 (START SAMPLING section of FIG. 9P). Then the inverted (by inverter INV2) falling edge of the COMPARATOR-RESET signal (START SAMPLING section of FIG. 9T) sets flip-flop F11 (START SAMPLING section of FIG. 9Q) thereby initiating the following conditions:

(a) Charge pump 22b is set on hold as a result of a "low" signal being applied to inputs 2 of gates G10 and G11;
(b) Multiplexer M3 selects the output signal of gate G6b (FIG. 9B) instead of the output signal of gate G7b (FIG. 9C) to input 1 of gate G3B.

The output signal of gate G6b, having frequency 1F, is advanced by ½ of the detent with respect to the 1F frequency output signal of gate G7b. The output signal of gate G7b generates a window set for data processing and the output signal of gate G6b generates a window set advanced by ½ of the detent with respect to the first one. To achieve the shift of exactly ½ of the detent, the signals on input 1 of gate G3b are strobed by the leading edge of the 4F VCO signal.

If the delay of delay line 14b is shorter than required for proper window centering, then the DOWN output of flip-flop F2B (shown by the solid line in the SAMPLING section of FIG. 9J) will remain low. This DOWN pulse is applied to the D input of flip-flop F12, whose FEEDBACK output signal will remain "low" (shown by the solid line in the SAMPLING section of FIG. 9R) when clocked by the following UP pulse (SAMPLING section of FIG. 9H) through the output of gate G12 (SAMPLING section of FIG. 9S). This UP pulse resets flip-flops F10 and F11 through gate G12 and buffers BUF1 and BUF2 thereby finishing the sampling operation and returning the phase locked loop to the normal mode of operation. The sampling operation can be repeated as many times as necessary.

The "low" state of the FEEDBACK signal indicates that the delay of delay line 14b needs to be increased. It is increased step by step by delay line control 16b, allowing the phase locked loop to realign the signals on the clock inputs of phase comparator flip-flops F1b and F2b.

When in a particular setting of delay line 14b the FEEDBACK signal will alternate between "high" and "low" states with a 50% probability (shown by the dashed line in the SAMPLING section of FIG. 9R), the delay line setting is correct and windows are centered.

Conclusion, Ramification and Scope

Thus it has been shown that a method and apparatus of the present invention provide for centering the data window in a multifrequency data separator which essentially does not depend on time delays and timing parameters of devices used in its construction. In addition, the method and apparatus are characterized by high accuracy, reliability and improved noice immunity.

Although the invention has been described and shown with reference to specific circuits and circuit components, as far as we know, window centering of all known data separators can be verified by creating a window shifted by ½ of the detent. Thus, the scope of the invention should be determined, not by the examples given, but by appended claims and their legal equivalents.

What we claim is:

1. A method for centering window intervals in a multi-frequency data separator for assigning raw read data pulses to a sequence of such window intervals, said window intervals having a period $T_d$ determined from a source of reference pulses, said data separator comprising means for generating said window intervals, first variable shifting means for shifting said window intervals by a variable time interval and second shifting means for shifting said window intervals by an interval $T_d/2$, said method comprising the steps of:

(a) applying said reference pulses from said source to said means for generating said window intervals to generate a first sequence of said window intervals in accord with said reference pulses,
(b) generating a second sequence of said, window intervals shifted with respect to said first sequence of window intervals by $T_d/2$,
(c) determining the relative fraction of the total number of said reference pulses being assigned by said data separator to corresponding window intervals of said second sequence, said step of determining employing means for comparing said reference pulses with said second sequence of window intervals, and
(d) shifting said first sequence of window intervals with said first variable shifting means in a direction that will minimize the difference of said fraction resulting from said step of determining with respect to 50%, thereby centering said window intervals with respect to said reference pulses.

2. The method of claim 1 wherein said first variable shifting means is capable of shifting said first sequence of windows over a range of time delay magnitudes from approximately zero to $T_d$.

3. The method of claim 1 wherein said step of determining the fraction comprises accumulating a binary tally indicative of the sense of relative association of a plurality of said reference pulses with a first subinterval of length ½ $T_d$ or with an adjacent second subinterval of length ½ $T_d$.

4. The method of claim 1 comprising associating reference pulses with corresponding window intervals, said associating being accomplished with the same comparison means employed in step (c).

5. Multi-frequency data separator apparatus for centering window intervals with respect to reference pulses, each window interval having length $T_d$, and reference pulse means for accepting said reference pulses at constant rate for definition of said intervals, comprising:

(a) first window generating means for establishing from said reference pulses a first sequence of window intervals, each said window interval having length $T_d$, (b) second window interval generating means for establishing a second sequence of window intervals, each of length $T_d$, said second sequence shifted with respect to said first sequence by an interval of substantially $\frac{1}{2} T_d$ whereby said reference pulse is associated with a subinterval $\frac{1}{2} T_d$ of any of said window interval of said first sequence of window intervals, (c) reference pulse detecting means for ascertaining whether a reference pulse is associated with a corresponding one of said second sequence of window intervals, (d) fraction determining means responsive to said reference pulse detecting means for determining the relative fraction of said reference pulses associated with corresponding window intervals of said second sequence, and (e) second sequence shift means for varying the degree to which said second sequence is shifted with respect to said first sequence to minimize the difference of said relative fraction with respect to 50% whereby said reference pulses are equally likely to occur in either adjacent $\frac{1}{2} T_d$ subintervals of corresponding adjacent window intervals of said first sequence.

6. The apparatus of claim 5 comprising means for shifting said first sequence of window intervals over a range of time delay magnitudes from approximately zero to $T_d$.

7. The apparatus of claim 5 wherein said fraction determining means comprises means for accumulating a binary tally indicative of the sense of relative association of a plurality of said reference pulses with a first subinterval of length $\frac{1}{2} T_d$ or with an adjacent second subinterval of length $\frac{1}{2} T_d$.

8. The apparatus of claim 5 wherein said reference pulse detecting means is employed for associating said reference pulses with corresponding window intervals.

9. A method for centering data in a window of a multifrequency data separator comprising a phase lock loop, said phase lock loop comprising frequency generating means, variable time delay generating means, counting means, phase comparison means, phase comparison enabling means, and phase comparison emulating means, said phase lock loop forming a contiguous timing scale of windows, each of said windows having period of $T_d$ defined by detent pulses occuring at frequency $f_d = 1/T_d$, said phase lock loop being arranged for assigning raw read data pulses to corresponding window intervals, said method achieving desired centering of said window intervals when said variable time delay generator is adjusted by the method to yield an optimum delay, said method comprising the steps of:

(a) locking said frequency generating means to a reference signal having a frequency $f_{ref}$, where said frequency generating means supplies a detent signal of frequency $jf_d$ where j is a positive integer, (b) setting the initial delay of said delay generating means to a value different from said optimum delay;

(c) applying to said phase comparator enabling means a signal having a frequency equal to $(1/p)f_d$, where p is an integer greater than zero, thereby setting said phase comparator enabling means and enabling said phase comparison means and said phase comparison emulating means, (d) passing said $(1/p)f_d$ frequency signal through said delay generating means thereby forming a delayed version of said signal $(1/p)f_d$, (e) phase-locking said delayed version of said $(1/p)f_d$ signal to another signal having a frequency equal to $(j/k)f_d$ where k is a positive integer less than or equal to j and j is an integral multiple of k, said another signal generated by said counting means from said $jf_d$ frequency signal, said counting means also generating a signal having a frequency equal to $(j/q)f_d$, where q is a positive integer less than or equal to j and j is an integral multiple of q, said $(j/q)f_d$ frequency signal having triggering edges earlier than the triggering edges of said $(j/k)f_d$ frequency signal by a time period approximately equal to $\frac{1}{2}$ of said window interval, (f) applying said $(j/q)f_d$ frequency signal to said phase comparison emulating means to create a reference shifted set of windows, and then testing the status of said phase comparison emulating means and thereby establishing whether said phase comparison emulating means has been enabled by said phase comparator enabling means, (g) changing said delay of said variable time delay generating means in the direction causing said delay to approach the optimum delay in response to establishing that said phase comparison emulating means has been enabled, (h) repeating steps (e), (f) and (g) until said phase comparison emulating means changes state from the initial state thereof while in step (f) close to 50% of the times step (f) is executed, thereby resulting in substantially centering said windows with respect to said data.

10. The method of claim 9 wherein said $(j/k)f_d$ frequency signal and said $(j/q)f_d$ frequency signal are strobed by said $jf_d$ frequency signal, with values of j restricted to integral multiples of 2, thereby resulting in centering of said windows substantially independent of the exact timing characteristics of said delay generating means, said phase comparator enabling means, and said phase comparison means.

11. The method of claim 9 wherein said initial delay of said delay generating means is set to a value smaller than optimum, said delay of said variable time delay generating means being increased until said phase comparison emulating means are set in step (f) close to 50% of the time.

12. The method of claim 9 wherein said initial delay of said delay generating means is set to a value greater than optimum, said delay of said variable time delay generating means being decreased until said phase comparison emulation means are not set in step (f) close to 50% of the time.

13. The method of claim 9 wherein said reference frequency $f_{ref} = (m/n)f_d$ where m and n are positive integers.

14. The method of claim 9 wherein said reference frequency $f_{ref} = (1/p)f_d$.

15. The method for centering data in a window of a multifrequency data separator comprising a frequency generating means, a variable time delay generating means, a phase comparator enabling means, counting means, phase comparison means, and frequency changing means, said data separator used for assigning raw read data pulses to respective windows, said windows each comprising a time interval having a frequency $f_d$, said method achieving desired centering when said variable time delay generator means is adjusted by the method to yield an optimum delay, said method comprising the steps of:
  (a) locking said frequency generating means to a signal having a frequency $f_{ref}$, with the use of said phase comparison means and said frequency changing means causing said frequency generating means to exhibit a frequency $jf_d$, where j is any integer greater than zero,
  (b) setting the initial delay of said delay generating means to a value different from optimum,
  (c) applying a signal having a frequency equal to $(1/p)f_d$, where p is a positive integer, to said phase comparator enabling means thereby setting said phase comparator enabling means and enabling said phase comparison means,
  (d) passing said $(1/p)f_d$ frequency signal through said delay generating means thereby forming a delayed version of said signal,
  (e) phase-locking said delayed version of said signal to a signal having a frequency equal to $(j/k)f_d$, where k is a positive integer less than or equal to j and j is an integral multiple of k, said signal being generated by said counting means from said $jf_d$ frequency signal, said counting means also generating a signal having a frequency equal to $(j/q)f_d$, where q is any positive integer less than or equal to j such that j is an integral multiple of q, said $(j/q)f_d$ frequency signal having triggering edges earlier than the triggering edges of said $(j/k)f_d$ frequency signal by a time period approximately equal to ½ of said window interval,
  (f) applying $(j/q)f_d$ frequency signal to said phase comparison means while disabling said frequency changing means, thus creating a reference shifted set of windows, and then testing the status of said phase comparison means thereby establishing whether said phase comparison means has been enabled by said phase comparator enabling means,
  (g) in response to said status, changing said delay of said delay generating means in the direction causing said delay to approach said optimum delay,
  (h) re-enabling said frequency changing means and re-applying said $(j/k)f_d$ frequency signal to said phase comparison means, and
  (i) repeating steps (f), (g) and (h) until said phase comparison means changes state from the initial state thereof while in step (f) close to the optimum value of 50% of the times step (f) is executed, thereby resulting in essentially optimum centering of said windows.

16. The method of claim 15 wherein said $(j/k)f_d$ frequency signal and said $(j/q)f_d$ frequency signal are strobed by said $jf_d$ frequency signal, with values of j restricted to integral multiples of 2, thereby resulting in centering of said window intervals substantially independent of the exact timing characteristics of said delay generating means, said phase comparator enabling means, and said phase comparison means.

17. The method of claim 15 wherein said initial delay of said delay generating means is set to a value smaller than optimum, said delay of said delay generating means being increased until said phase comparison emulating means are set in step (f) close to 50% of the time.

18. The method of claim 15 wherein said initial delay of said delay generating means is set to a value greater than optimum, said delay of said delay generating means being decreased until said phase comparison emulation means are not set in step (f) close to 50% of the time.

19. The method of claim 15 wherein said reference signal frequency $f_{ref} = (m/n)f_d$ where m and n are positive integers.

20. The method of claim 15 wherein said reference frequency $f_{ref} = (1/p)f_d$.

21. In a multifrequency data separator for assigning raw read data pulses to their corresponding window intervals, said window intervals each defined by two detent pulses, said detent pulses occuring at frequency $f_d$, said data separator comprising signal delaying means for varying the relative time of occurence at the output thereof for raw read pulses, phase comparator means for ascertaining the relative time of occurence of said delayed raw read pulses in relation to clock pulses, charge pump means connected to the output of said phase comparison means, filtering means connected to the output of said charge pump means, voltage-controlled oscillator means connected to the output of said filtering means said voltage-controlled oscillator providing an output signal denoted VCO output comprising said clock pulses at a rate $f_d$, the improvement comprising:
  reference signal means for enabling said phase comparison means and for obtaining reference pulses for establishing window interval centering, and
  centering means for centering said window intervals with respect to corresponding said raw read pulses, said means comprising phase comparison emulating means and counting means, said emulating means comprising elements having timing characteristics similar to those of said phase comparison means, said counting means being connected to said emulating means and comprising logic means for clocking said emulating means earlier than said phase comparison means by a time period approximately equal to ½ of said window whereby the correct centering of said window is indicated.

22. The apparatus of claim 21, wherein the VCO output signal means has a frequency of $2jf_d$, where j is a positive integer, and said VCO output signal strobes the output signal of said counting means for optimal window centering.

23. In a multifrequency data separator for assigning raw read data pulses to their corresponding window intervals, said window intervals defined by two detent pulses, said detent pulses occuring at frequency $f_d$, said data separator comprising signal delaying means for varying the relative time of occurence at the output thereof for said raw read pulses, phase comparison means for ascertaining the relative time of occurence of said delayed raw read pulses in relation to reference pulses, charge pump means connected to the output of said phase comparison means, filtering means connected to the output of said charge pump means, a voltage-controlled oscillator means providing an output signal denoted VCO output at rate $f_d$, said voltage-controlled oscillator connected to the output of said filtering means, the improvement comprising:
  reference signal means for enabling said phase comparison means and for furnishing reference pulses for establishing window interval centering, and
  centering means for centering said window intervals in relation to corresponding said reference pulses, said means for centering comprising delay setting logic means and counting means, said counting means comprising logic means for clocking said phase comparison means at selected alternative clocking phases, said alternative clocking phases comprising phases $\phi_1$ and $\phi_2$, phase $\phi_1$ occurring ½ of said window interval before phase $\phi_2$, and said delay setting logic means comprising test means to select which said clocking phase is to be applied to said phase comparison means, said testing means intermittently selecting phase $\phi_2$ for determining the deviation of centering of said window interval with respect to said reference pulses and generating a centering deviation signal, said testing means further operative for selecting phase $\phi_1$, said phase $\phi_1$ used for assigning said raw read data pulses to corresponding window intervals and for locking said voltage controlled oscillator to said reference means.

24. The apparatus of claim 23, wherein said voltage-controlled oscillator means generates a VCO output signal of frequency $2jf_d$, where j is a positive integer, and said VCO output signal strobes the counting means output signal of said counting means whereby said raw read pulses tend to be centered in said window.

25. Multifrequency data separator apparatus for assigning raw read pulse comprising data to respective window intervals each of duration $T_d$, said apparatus comprising,
  (a) clock pulse source means for providing clock pulses,
  (b) phase comparator for determining the relative phase of a reference pulse applied thereto relative to a clock pulse,
  (c) phase comparison enabling means for providing an enabling signal to enable said phase comparator substantially ½ $T_d$ prior to application of said reference pulse to said phase comparison means,
  (d) intermittent sampling means for advancing at least one clock pulse in time by ½ $T_d$, whereby said phase comparator is clocked early by ½ $T_d$,
  (e) test means for ascertaining the time relationship of said enabling signal and said clock pulse and for providing a centering correction signal.

26. The multifrequency data separator of claim 25 wherein said test means comprises:
  (f) fraction determining means for repetitiously actuating both said intermittent sampling means and said test means at selected intervals and in response thereto developing a fraction signal indicative of the fraction of said repetitious actuations resulting in coincidence of a portion of said enabling signal with one said clock pulse, and
  (g) centering error means for developing a signal representative of the difference of said fraction signal error with respect to 50% probability.

27. The method of ascertaining the deviation from centering of selected data pulses within corresponding window intervals of length $T_d$ comprising the steps of
  (a) creating a first train of detent pulses of frequency $f_d$,
  (b) defining each said window interval from a leading and a trailing detent pulse,
  (c) phase locking a train of reference pulses of frequency $f_d$ substantially equidistant of said leading and trailing detent pulses,
  (d) creating a train of shifted detent pulses, each said shifted detent pulse displaced by ½ $T_d$ from respective detent pulses of said first train,
  (e) presenting an enabling signal to enable a phase comparator, said enabling signal obtained from said reference pulses,
  (f) applying a shifted detent pulse to said phase comparator, said shifted detente pulse occuring ½ $T_d$ earlier than the trailing detent pulse, whereby the time relationship of said enabling signal to said shifted detent pulse is ascertained,
  (g) obtaining a window centering error signal from said time relationship.

28. In a multifrequency data separator for assigning raw read data pulses to corresponding window intervals, each said window of length $T_d$ and having a center at ½ $T_d$, the method of ascertaining the deviation of said raw read data pulses from said centers of said corresponding windows, comprising the steps of
  (a) shifting said window intervals by ½ $T_d$ to establish a shifted sequence of window intervals,
  (b) associating raw read data pulses with window intervals of said shifted sequence whereby the relative time of occurence of said raw read data pulses is determinable with respect to said centers, and
  (c) generating a signal indicative of the relative time of occurence of said raw read data pulses to said centers.

* * * * *